(12) United States Patent
Domeij

(10) Patent No.: US 8,907,351 B2
(45) Date of Patent: Dec. 9, 2014

(54) BIPOLAR JUNCTION TRANSISTOR IN SILICON CARBIDE WITH IMPROVED BREAKDOWN VOLTAGE

(71) Applicant: Fairchild Semiconductor Corporation, San Jose, CA (US)

(72) Inventor: Martin Domeij, Sollentuna (SE)

(73) Assignee: Fairchild Semiconductor Corporation, San Jose, CA (US)

(*) Notice: Subject to any disclaimer, the term of this patent is extended or adjusted under 35 U.S.C. 154(b) by 0 days.

(21) Appl. No.: 14/068,941

(22) Filed: Oct. 31, 2013

(65) Prior Publication Data

US 2014/0054612 A1  Feb. 27, 2014

Related U.S. Application Data

(63) Continuation of application No. PCT/EP2012/057565, filed on Apr. 25, 2012.

(60) Provisional application No. 61/481,932, filed on May 3, 2011.

(30) Foreign Application Priority Data

May 3, 2011  (SE) ........................ 1150386

(51) Int. Cl.
  *H01L 29/15* (2006.01)
  *H01L 29/66* (2006.01)
  *H01L 29/73* (2006.01)
  *H01L 29/40* (2006.01)
  *H01L 29/16* (2006.01)
  *H01L 29/732* (2006.01)
  *H01L 29/739* (2006.01)

(52) U.S. Cl.
  CPC ...... *H01L 29/7393* (2013.01); *H01L 29/66068* (2013.01); *H01L 29/73* (2013.01); *H01L 29/402* (2013.01); *H01L 29/1608* (2013.01); *H01L 29/732* (2013.01)
  USPC .......................................... 257/77

(58) Field of Classification Search
  CPC ................... H01L 29/66234; H01L 29/66931; H01L 21/8222; H01L 27/0255
  USPC ............. 257/76, 152, 164, 583, E29.191, 77, 257/198, E29.174; 438/136, 170, 309
  See application file for complete search history.

(56) References Cited

U.S. PATENT DOCUMENTS

4,945,394 A  7/1990  Palmour et al.
7,345,310 B2  3/2008  Agarwal et al.
(Continued)

FOREIGN PATENT DOCUMENTS

CN  101425536 A  5/2009
EP  1806787 A2  7/2007
(Continued)

OTHER PUBLICATIONS

Ghandi, Reza et al., "Surface-Passivation Effects on the Performance of 4H-SiC BJTs", IEEE Transactions on Electron Devices, vol. 58, No. 1, Jan. 2011, XP-002679486, 7 pages.

(Continued)

*Primary Examiner* — Jarrett Stark
*Assistant Examiner* — Shahed Ahmed

(57) ABSTRACT

In one general aspect, a silicon carbide (SiC) bipolar junction transistor (BJT) can include a collector region, a base region having an extrinsic part, and an emitter region. The SiC BJT can include a surface passivation layer deposited on the extrinsic part between an emitter contact contacting the emitter region and a base contact contacting the base region. The SiC BJT can also include a surface gate at the surface passivation layer where the surface gate has at least a portion disposed over the extrinsic part of the base region.

20 Claims, 3 Drawing Sheets

(56) References Cited

U.S. PATENT DOCUMENTS

| | | | |
|---|---|---|---|
| 7,906,796 B2 * | 3/2011 | Mochizuki et al. | 257/164 |
| 7,947,988 B2 | 5/2011 | Kono et al. | |
| 8,378,390 B2 | 2/2013 | Domeij | |
| 2006/0006415 A1 | 1/2006 | Wu et al. | |
| 2008/0251940 A1 * | 10/2008 | Lee et al. | 257/777 |
| 2009/0057685 A1 | 3/2009 | Mochizuki et al. | |
| 2010/0001290 A1 | 1/2010 | Nonaka | |
| 2012/0007103 A1 | 1/2012 | Domeij | |
| 2013/0126910 A1 | 5/2013 | Domeij | |

FOREIGN PATENT DOCUMENTS

| | | |
|---|---|---|
| WO | 2006/135031 A2 | 12/2006 |
| WO | 2010/110725 A1 | 9/2010 |
| WO | 2012/150161 A1 | 11/2012 |

OTHER PUBLICATIONS

Lee, H.-S. et al., "Surface Passivation Oxide Effects on the Current Gain of 4H-SiC bipolar junction transistors", Applied Physics Letters, 92, 082113 (2008), 3 pages.

International Search Report received for PCT Patent Application No. PCT/SE2010/050310, mailed on Jun. 30, 2010, 5 pages.

International Preliminary Report on Patentability received for PCT Patent Application No. PCT/SE2010/050310, mailed on Sep. 27, 2011, 6 pages.

International Search Report received for PCT Patent Application No. PCT/EP2012/057565, mailed Aug. 7, 2012, 9 pages.

Written Opinion of the International Preliminary Examining Authority for International Application No. PCT/EP2012/057565, Apr. 18, 2013, 5 pages.

* cited by examiner

BIPOLAR JUNCTION TRANSISTOR IN SILICON CARBIDE WITH IMPROVED BREAKDOWN VOLTAGE

RELATED APPLICATIONS

This application is a continuation application of International Application No. PCT/EP2012/057565, filed Apr. 25, 2012, which claims priority to U.S. Application No. 61/481,932, filed May 3, 2011 and Swedish Application No. 1150386-9, filed May 3, 2011, each of which is incorporated by reference herein in its entirety.

FIELD

The present invention relates to the field of power semiconductor device technology and, in particular, to silicon carbide bipolar junction transistors for high power applications. The present invention relates also to methods of manufacturing such silicon carbide bipolar junction transistors.

BACKGROUND

Power transistors may be used as switches in power electronic systems. The switches alternate between conducting a high current in the on-state and blocking a high voltage in the off-state. Two important figures of merit for power switches are low power losses during forward conduction and low power losses during switching between on and off. Low power losses are beneficial because they enable energy savings and because more compact systems can be constructed as the heat dissipation caused by the power losses is reduced.

Silicon carbide (SiC) bipolar junction transistors (BJTs) are power transistors that have the advantage of providing substantially lower power losses during conduction and switching as compared to standard silicon (Si) power transistors thanks to the high breakdown electric field of SiC. In addition, SiC has a high thermal conductivity and is a wide bandgap semiconductor and may therefore advantageously be used for manufacturing devices for high power, high temperature and high frequency applications.

Thus, there is a need for providing new designs of SiC BJTs and new methods of manufacturing such BJTs that would alleviate at least some of the above-mentioned drawbacks.

SUMMARY

This is disclosure is related to alleviating at least some of the above disadvantages and drawbacks of the prior art and to providing an improved alternative to prior art SiC BJTs.

Generally, this disclosure is related to a SiC BJT with improved blocking capabilities, i.e. with an improved breakdown voltage. Further, it is an object of the present invention to provide methods of manufacturing such a SiC BJT.

These advantages are achieved by the SiC BJT and the method of manufacturing such a SiC BJT as defined in, for example, the independent claims.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, in which.

Figure 1:
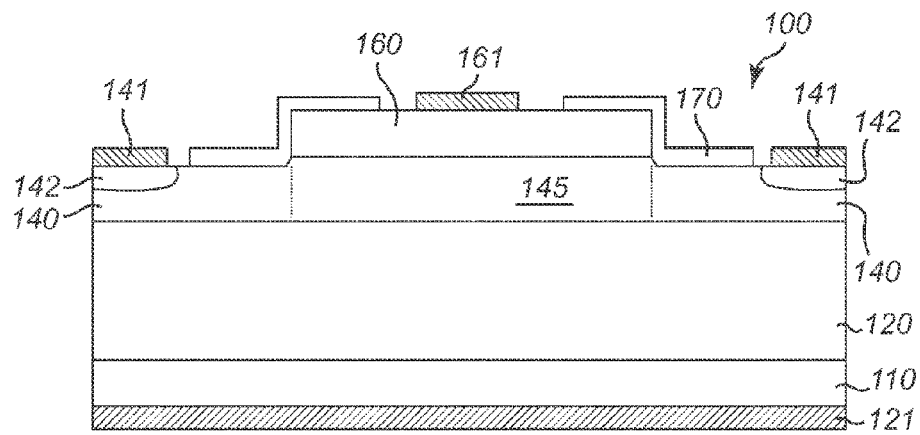
FIG. 1 shows a schematic cross-sectional view of a standard SiC BJT.

All the figures are schematic, not necessarily to scale, and generally only show parts which are necessary in order to elucidate the invention, wherein other parts may be omitted or merely suggested.

DETAILED DESCRIPTION

According to a first aspect of the present invention, there is provided a silicon carbide (SiC) bipolar junction transistor (BJT). The SiC BJT comprises a collector region, a base region and an emitter region. Further, a surface passivation layer is deposited between an emitter contact for contacting the emitter region and a base contact for contacting the base region. The deposited surface passivation layer induces the formation of a depletion region under the surface passivation layer in the extrinsic part of the base region. Further, the SiC BJT comprises a surface gate (or surface electrode) arranged at the deposited surface passivation layer. The surface gate is configured to apply a negative electric potential to the deposited surface passivation layer with respect to the electric potential in the base region.

According to a second aspect of the present invention, there is provided a method of manufacturing a SiC BJT including a collector region, a base region and an emitter region. The method comprises the steps of depositing a surface passivation layer on top of the BJT, the deposited surface passivation layer inducing the formation of a depletion region under the surface passivation layer in the extrinsic part of the base region, and providing (or forming) a surface gate at the surface passivation layer. The surface passivation layer is arranged between an emitter contact for contacting the emitter region and a base contact for contacting the base region. The surface gate is arranged to apply a negative electric potential with respect to the electric potential in the base region.

The present invention is based on the understanding that a surface passivation layer deposited between the emitter contact and the base contact (which surface passivation layer may have been subsequently annealed after deposition) may induce the formation of a depletion region under the surface passivation layer in the extrinsic part of the base region and that the presence of such a depletion region reduces the effective thickness of the base region and thereby limits (or decreases) the breakdown voltage of the BJT due to punch-through. The formation of a depletion region, which extends below the surface of the base region, reduces the separation distance between the depletion regions at the base-collector and the base-emitter junctions and this causes a reduction of the collector-emitter punch-through breakdown voltage. In the present invention, a surface gate (or surface electrode) is provided at the deposited surface passivation layer and the surface gate is configured such that a negative electric potential with respect to the electric potential in the base region can be applied to the deposited surface passivation layer. With the present invention, the depletion region induced by the deposited surface passivation layer can be reduced in size (and preferably suppressed) and a BJT with an improved punch-through breakdown voltage is achieved. The present invention is therefore advantageous in that it provides a BJT with an improved breakdown voltage.

Further, the BJT of the present invention is also advantageous in that it provides the benefit of a deposited (and possibly subsequently annealed) surface passivation layer in terms of improved current gain (as compared to BJTs comprising surface passivation layers e.g. grown by conventional thermal oxidation). In the present invention, a surface passivation layer providing a high or even the highest common emitter current gain, for example a passivation layer obtained by deposition (such as PECVD) and subsequent annealing, may be selected for the SiC BJT although it induces the formation of a depletion region in the extrinsic part of the base region. The inventors have recognized that such a deposited (and possibly annealed) surface passivation layer may result in the formation of a depletion region in the SiC region located under the surface passivation layer and that a surface gate may be provided for enabling appliance of a negative potential to the deposited surface passivation layer with respect to the potential of the SiC region in order to reduce, and possibly suppress, such a depletion region.

In other words, the invention is advantageous in that it provides the benefits of a deposited surface passivation layer, although it induces a depletion region in the extrinsic part of the base region, like e.g. in terms of common emitter current gain, while still providing improved blocking capabilities.

It will be appreciated that the base region (or base layer) of a SiC BJT is normally defined by two parts (or regions), the intrinsic part interfacing (or capped by) the emitter region and the extrinsic part not capped by the emitter region. The outer sidewalls of the emitter region define the boundary limits between these two parts. The presence of the deposited surface passivation layer on top of the BJT results in the formation of a depletion region in the extrinsic part of the base region.

The depletion region is present in the extrinsic part of the base region of the BJT after deposition of the surface passivation layer (under steady state conditions and before appliance of any negative electric potential to the surface gate of the BJT). In the case of a thermally grown oxide such as used in conventional BJTs, no (or at least negligible) depletion region is formed.

Advantageously, the surface gate may be configured to apply an electric potential having a value (magnitude) for reducing, and preferably eliminating, the depletion region formed under the surface passivation layer in the extrinsic part of the base region. In the present embodiment, the surface gate may be configured to apply an electric potential to the deposited surface passivation layer independently of any other applied potentials such as those applied to e.g. the emitter contact and the base contact of the BJT. The surface gate may be configured to apply any potential value to the deposited surface passivation layer, and in particular a negative potential suppressing the depletion region formed below the base surface because of the presence of the deposited surface passivation layer.

The depletion region resulting from deposition of the surface passivation layer may probably be due to pinning of the surface potential and formation of a surface inversion channel of electrons. In this case, a depletion region with negatively charged acceptor ions reaching down below the top surface is formed. The formation of such a depletion region at the surface may depend on several factors such as the doping concentration of the base layer or base region, the thickness of the surface passivation layer, the charge in the surface passivation layer and/or the charge at the interface between SiC and the surface passivation layer. The occurrence of such a depletion region may therefore depend on the detailed process technology conditions and in particular on the method used to fabricate the surface passivation layer. The negative potential to be applied to the deposited surface passivation layer may then be selected accordingly. For example, a negative potential of about 2 Volts has shown to perform well for a SiC BJT comprising a 650 nm thick base region having a doping level of about $3\times10^{17}$ cm$^{-3}$ and a 100 nm thick surface passivation layer deposited by PECVD followed by a post-anneal at a temperature of about 1100-1300° C. for a duration of about 0.5 to 4 hours in $N_2O$. As will be further explained below, a negative potential of about 2 V may also be obtained by connecting the surface gate to the emitter contact.

According to an embodiment, the base dose, $Q_B$, of the base region may be determined as a function of a desired punch-through breakdown voltage, $V_{CE-PT}$, for the BJT according to the following expression:

$$V_{CE\text{ }iPT} \approx \frac{q \times Q_B^2}{2 \times \varepsilon_S \times N_C} \qquad \text{Equation 1}$$

wherein $N_C$ is the doping concentration for the collector region, q is the electron charge ($1.6\times10^{-19}$ C) and $e_s$ is the dielectric constant of SiC.

It will be appreciated that the base dose $Q_B$ may be determined by the doping level $N_B$ in the base region and the thickness $W_B$ of the base region. The base dose may be calculated by multiplying the base thickness $W_B$ with the doping level (or doping concentration) $N_B$ in case of a constant doping level through the thickness of the base region or may be calculated as the integral of the doping level (doping concentration) over the thickness of the base region.

Further, it will be appreciated that Equation 1 provides an approximation of the punch-through breakdown voltage (or the base dose) and that it is applicable for normal base and collector doping concentrations in a SiC BJT designed for a high voltage of 600 V or higher. This means that the doping concentration in the base region is in general more than ten times higher than the doping concentration in the collector region and that the doping concentration in the collector region is designed for state-of-the-art performance in terms of forward voltage drop for a given voltage rating. For example, design conditions for a 1200 V SiC BJT can be a doping concentration of the base region in the range of $1.5\times10^{17}$ cm$^{-3}$ to $5\times10^{17}$ cm$^{-3}$, a doping concentration for the collector region in the range of $5\times10^{15}$ cm$^{-3}$ to $1.5\times10^{16}$ cm$^{-3}$ and a collector thickness in the range of 15 μm to 8 μm (micrometers). It will be appreciated that an adequate collector thickness may be selected depending on the selected doping concentration of the collector region.

With the present embodiment, the parameters of the base region, and in particular the base dose, may be defined in accordance with a desired or targeted punch-through breakdown voltage. The present embodiment is advantageous in that, with the surface gate configured to apply a negative potential to the deposited surface passivation layer with respect to the electric potential in the base region, the punch-through breakdown voltage increases to values which are close to the value calculated using equation 1. In contrast, prior art BJTs present large discrepancies from expected punch-through breakdown voltages. The base dose in prior art BJTs has so far been determined in an empirical manner. The present invention is therefore advantageous in that it facilitates and improves the design of SiC BJTs, in accordance with equation 1. As will be further illustrated in the detailed description, the present invention provides a good correlation between the desired (or targeted) breakdown voltage of a SiC BJT and its true (measured) breakdown voltage.

It will be appreciated that the breakdown voltage of the SiC BJT is determined by either the punch-through breakdown voltage or the avalanche breakdown voltage depending on which of them has the lowest value. The desired punch-through breakdown voltage may therefore preferably be determined using equation 1 and such that it is larger than the avalanche breakdown voltage.

According to an embodiment, the base dose of the base region may be comprised in the range of $1\text{-}1.9\times10^{13}$ cm$^{-2}$, such as $1.1\text{-}1.5\times10^{13}$ cm$^{-2}$, and is preferably equal to about $1.3\times10^{13}$ cm$^{-2}$. With the parameters defined in the present embodiment, a punch-through breakdown voltage of about 1500 V can be achieved for a standard doping concentration of the collector region in the range of about $5\text{-}9\times10^{15}$ cm$^{-3}$. Even more specifically, for a doping concentration of $6\times10^{15}$ cm$^{-3}$ in the collector region, the base dose may preferably be equal to $1.4\times10^{13}$ cm$^{-2}$. The present embodiment is advantageous in that it provides a 1200 V rating of a power transistor made in SiC. In contrast, the base dose for conventional SiC BJTs of equivalent rating is $2\times10^{13}$ cm$^{-2}$, i.e. of a higher value, which has the disadvantage of reducing the current gain.

According to an embodiment, the surface passivation layer may be located on a sidewall of the base-emitter junction, or a sidewall of the emitter region, and extend on the surface of the BJT towards the base contact. The highest effect provided by the surface passivation layer with respect to increase of the current gain is obtained by the portion covering the extrinsic part of the base region and the corner defined by the intersection of this portion with the elevated structure (or mesa) defining the emitter region. Thus, the surface passivation layer may be located at least in the portion covering the extrinsic part of the base region and the corner defined by the intersection between the etched surface of the base region and the emitter mesa.

According to an embodiment, the surface passivation layer may be made of a dielectric material and the surface gate may be made of a conductive material. For example, the surface passivation layer may be made of silicon dioxide deposited by e.g. PECVD and the surface gate may be made of highly doped poly-silicon or metal such as aluminum, titanium or titanium tungsten.

According to an embodiment, the surface gate may be electrically connected to the emitter contact. As a result, the electric potential applied to the surface gate is the same as the electric potential applied to the emitter contact. In the present embodiment, the electric potential applied to the surface passivation layer is therefore determined by the electric potential applied to the emitter contact. The present embodiment is particularly advantageous in that it facilitates the design and the manufacturing of the SiC BJT since a single electrode needs to be formed for both the emitter region and the surface gate.

Still referring to the embodiment wherein the surface gate may be electrically connected to the emitter contact, the value of the electric potential applied to the surface passivation layer corresponds to the value of the electric potential applied to the emitter region. In case the applied potential is not sufficient to compensate for the depletion region formed under the surface passivation layer, i.e. to sufficiently reduce or suppress the depletion region, the thickness of the surface passivation layer may be adjusted such that the value of the targeted punch-through breakdown voltage can be reached. A decrease of the thickness of the surface passivation layer (i.e. a thinner surface passivation layer) enhances the effect of the electric potential applied via the surface gate and decreases the depletion region more effectively, thereby increasing the punch-through breakdown voltage. However, a decrease of the thickness of the surface passivation layer may also increase the risk for dielectric breakdown in the surface passivation layer, i.e. in the dielectric material itself. The thickness of the surface passivation layer may therefore be adjusted accordingly. For a silicon dioxide layer deposited by PECVD, the thickness of the surface passivation layer may be in the range of about 100 nanometers. For such surface passivation layers, when the surface gate is connected to the emitter contact, the electric potential applied to the surface passivation layer may be in the range of about 2-3 Volts for typical bias conditions.

Referring to the method of manufacturing a SiC BJT in accordance with the second aspect of the present invention, the step of deposition may include plasma enhanced chemical vapor deposition (PECVD) of a silicon dioxide layer. Further, the PECVD or more generally the deposition of the surface passivation layer may be followed by post-deposition-anneal in e.g. $N_2O$ or NO ambient. Post-annealing in NO ambient is advantageous in that it further increases the current gain of the transistor.

The annealing subsequent to the deposition of the surface passivation layer may be performed at a temperature of about 1000-1400° C., such as 1100-1300° C. for a duration in the range of about 0.5 to 4 hours.

It will be appreciated that the embodiments described above in connection to the first aspect of the present invention are also combinable with any of the embodiments described in connection to the manufacturing method of the second aspect of the present invention, and vice versa.

Further features of, and advantages with, the present invention will become apparent when studying the following detailed disclosure, the drawings and the appended claims. Those skilled in the art will realize that different features of the present invention can be combined to create embodiments other than those described in the following.

With reference to FIG. 1, a standard SiC BJT 100 is described. The SiC BJT 100 comprises a substrate 110 on which a collector layer 120, a base layer 140 and an emitter layer 160 have been grown by epitaxy. In the case of a NPN SiC BJT, the epitaxial structure may normally comprise a low-doped n-type collector layer 120 grown on top of a highly doped n-type substrate 110, a p-type base layer 140 and a highly doped n-type emitter layer 160. After epitaxial growth, the emitter region 160 and the base region 140 are defined using dry etch techniques, thereby providing an elevated emitter region or mesa (i.e. elevated structure) 160. Ohmic contacts 161 and 141 are formed to the emitter region 160 and the base region 140, respectively, and a collector Ohmic contact 121 may be formed at the backside of the substrate 110 to connect the collector region 120.

The Ohmic contact 141 to the base region 140 may be improved by providing a region 142 having an increased acceptor doping using e.g. selective ion implantation followed by a subsequent high-temperature anneal before forming the contact 141. The portion of the base layer 140 located under the emitter mesa 160, i.e. within the outline of the emitter edges, is conventionally referred to as the intrinsic base region 145 whereas the portion of the base layer 140 not capped with the emitter region 160 is conventionally referred to as the extrinsic base region (or extrinsic part of the base region).

Further, a dielectric layer 170 may be used for surface passivation on top of the SiC BJT 100, between the base and emitter metal contacts (denoted respectively as 141 and 161), in order to terminate the dangling bonds of the atoms on the SiC surface, and thereby reduce the density of defects which cause surface recombination and surface leakage currents.

Figures 2A, 2B:
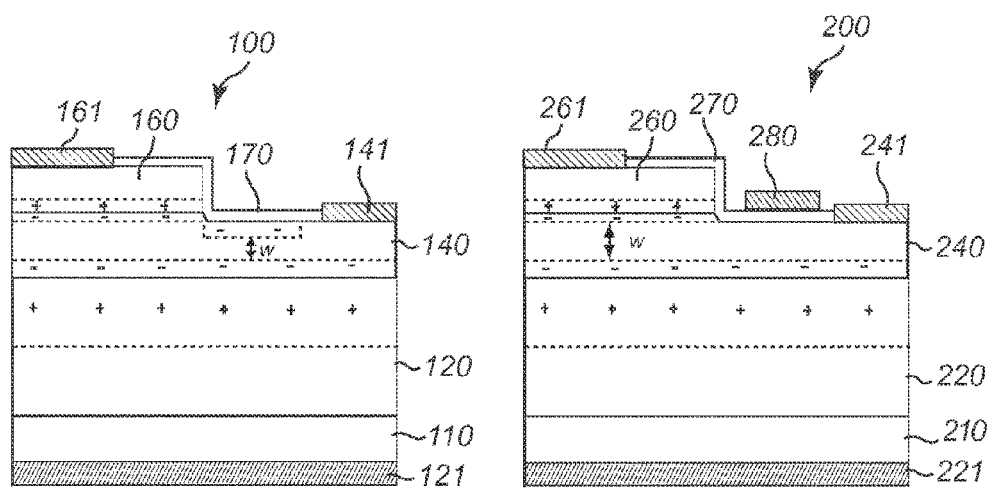
FIG. 2a illustrates the limitation in breakdown voltage due to a deposited surface passivation layer.
FIG. 2b shows a schematic cross-sectional view of a SiC BJT in accordance with an exemplifying embodiment of the present invention.

With reference to FIG. 2a, the limitation in breakdown voltage in a SiC BJT due to a deposited surface passivation layer is illustrated.

FIG. 2a shows a SiC BJT 100 comprising a substrate 110 on which a collector layer 120, a base layer 140 and an emitter layer 160 have been grown. The structure of the SiC BJT 100 shown in FIG. 2a is equivalent to the structure of the SiC BJT described above with reference to FIG. 1. The surface passivation layer 170 may be made of a dielectric material such as e.g. silicon dioxide deposited on top of the SiC BJT 100. The purpose of the surface passivation layer 170 is to stabilize the surface recombination of minority carriers. The surface passivation layer 170 may cover an edge of the elevated emitter region 160 (or emitter mesa) and part of the extrinsic part of the base region 140.

More specifically, FIG. 2a shows the SiC BJT 100 in the blocking mode with a representation of the depletion regions formed in the device under such conditions, in particular the depletion region formed under the surface passivation layer 170 in the extrinsic part of the base region 140 (i.e. at the etched surface of the base region 140). The depletion region formed under the surface passivation layer 170 may be formed due to pinning of the surface potential and formation of a surface inversion channel of electrons. As a result, the effective thickness of the base region is reduced, thereby reducing the punch-through electrical breakdown of the BJT. The separation between the space charge region formed at the collector-base boundary and the space charge region formed at the base-emitter boundary is denoted W in the figures. In FIG. 2a, the formation of the depletion region under the deposited surface passivation layer 170 in the extrinsic part of the base region 140 (i.e. which extends below the surface of the base region 140) reduces the separation W.

With reference to FIG. 2b, there is shown a schematic view of a SiC BJT in accordance with an exemplifying embodiment of the present invention.

FIG. 2b shows a SiC BJT 200 comprising a substrate 210 on which a collector layer 220, a base layer 240 and an emitter layer 260 have been grown. The SiC BJT 200 shown in FIG. 2b is equivalent to the SiC BJT 100 described with reference to FIG. 2a except that it further comprises a surface gate 280 (or surface electrode) arranged at the deposited surface passivation layer 270. The surface gate 280 may be a metal electrode which is located on top of the surface passivation layer 270 which is present on the etched side-wall of the base-emitter junction and along the exposed base and emitter surfaces. The surface gate 280 is configured to apply a negative potential to the deposited surface passivation layer 270 with respect to the electric potential in the base region 240. As illustrated in FIG. 2b, appliance of a negative potential to the deposited surface passivation layer 270 with respect to the electric potential of the base region 240 reduces and, possibly totally suppresses, the depletion region formed in the extrinsic part of the base region 240 as a result of the deposition of the surface passivation layer 270. Consequently, the separation or distance W between the space charge region formed at the collector-base boundary and the space charge region formed at the base-emitter boundary is increased as compared to that obtained without appliance of a negative potential to the deposited surface passivation layer (i.e. the effective thickness of the base region is increased as compared to that shown in FIG. 2a). The transistor 200 described with reference to FIG. 2b is advantageous in that the punch-through breakdown voltage is increased and, thus, that it provides improved blocking capabilities.

In addition, the effective thickness of the base region corresponds to the separation or distance W between the space charge region formed at the collector-base boundary and the space charge region formed at the base-emitter boundary, without being affected by any space charge region (or depletion region) formed or induced in the extrinsic part of the base region. Accordingly, the resulting punch-through breakdown voltage of the device is more easily predictable, thereby facilitating the design of the device.

The SiC BJT 200 comprises also contact areas 261 and 241 for electrical connection to the emitter region 260 and the base region 240, respectively, and another contact area 221 formed at the backside of the substrate 210 for electrical connection the collector region 220.

The SiC BJT 200 may be a NPN vertical BJT comprising a n-type collector region 220 disposed on a highly-doped n-type substrate 210, a p-type base region 240 and an n-type emitter region 260. The vertical direction corresponds to the growth direction of the layers forming the collector region 220, the base region 240 and the emitter region 260 on top of the substrate 210.

Figures 3, 4:
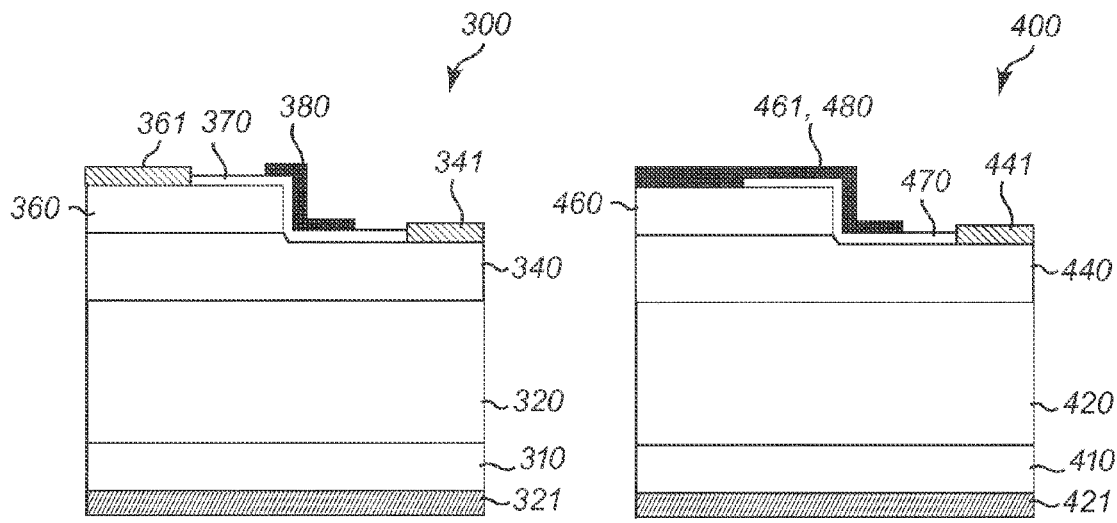
FIGS. 3 and 4 show schematic cross-sectional views of SiC BJTs in accordance with other exemplifying embodiments of the present invention.

With reference to FIGS. 3 and 4, there are shown schematic views of SiC BJTs in accordance with other exemplifying embodiments of the present invention.

FIGS. 3 and 4 show SiC BJTs 300 and 400, respectively, whose structures are equivalent to the structure of the SiC BJT 200 described with reference to FIG. 2b but with another design of the surface gate.

As compared to the SiC BJT 200 shown in FIG. 2b, FIG. 3 shows an embodiment wherein the surface gate 380 of the SiC BJT 300 covers at least part of the surface located above the extrinsic part of the base region 340 but also extends towards the emitter contact 361 by covering an edge of the mesa or elevated structure of the emitter region 360. In the embodiments described with reference to FIGS. 2b and 3, the surface gates or electrodes 280 and 380, respectively, are electrically isolated from the emitter and base contacts (denoted 261 and 241, respectively, in FIG. 2b and denoted 361 and 341, respectively, in FIG. 3) and enable application of an arbitrary bias between the surface gate 380 and the emitter and base contacts (denoted 361 and 341). In FIG. 3, the surface passivation layer is denoted 370, the collector region is denoted 320, the substrate is denoted 310 and the collector contact is denoted 321.

In FIG. 4, an embodiment wherein the surface gate 480 of the SiC BJT 400 may be electrically connected to the emitter contact 461 of the emitter region 460 is shown. In the present embodiment, the emitter contact 461 extends towards the base contact 441 of the base region 440 (without electrically connecting the base contact 441) and covers at least part of the deposited surface passivation layer 470. In this configuration, the emitter contact 461 is herein referred to as an emitter extended gate. As the emitter extended gate 461 is connected to the emitter region 460, it supplies a negative electric potential, with respect to that of the base region 440, for operating the transistor 400 in blocking mode and thereby applies a negative electric potential on top of the deposited surface passivation layer 470 with respect to that of the base region 440. As a result, the depletion region formed under the surface passivation layer in the extrinsic part of the base region is reduced and a BJT with improved blocking capabilities is provided. In FIG. 4, the collector region is denoted 420, the substrate is denoted 410 and the collector contact is denoted 421.

Figure 5:
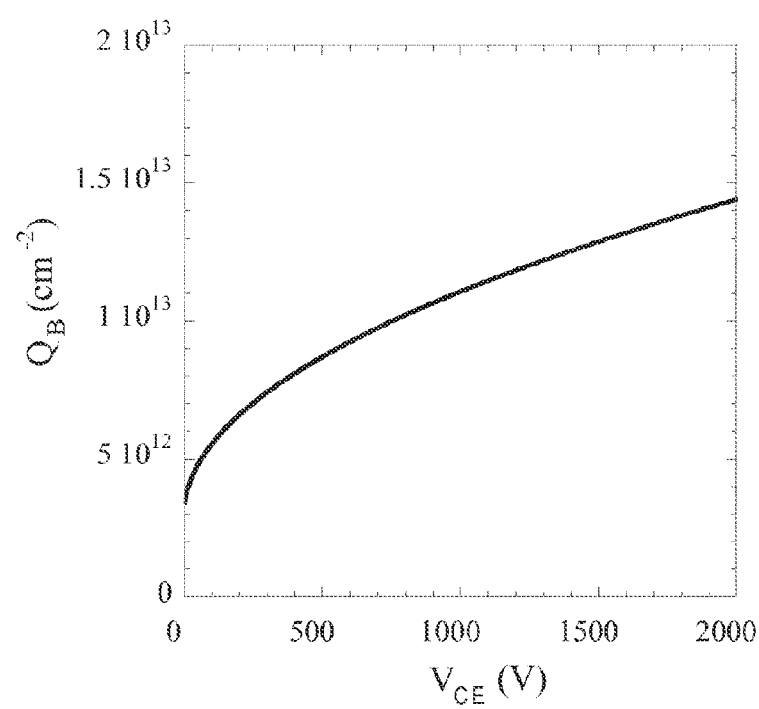
FIG. 5 shows the calculated base dose as a function of punch-through breakdown voltage for a base doping of $3 \times 10^{17}$ cm$^{-3}$ and a collector doping of $6 \times 10^{15}$ cm$^{-3}$.

FIG. 5 shows the calculated base dose as a function of punch-through breakdown voltage ($V_{CE}$) for a base doping of $3 \times 10^{17}$ cm$^{-3}$ and a collector doping of $6 \times 10^{15}$ cm$^{-3}$, in accordance with Equation 1. The graph in FIG. 5 indicates that a base dose of about $1.3 \times 10^{13}$ cm$^{-2}$ provides a punch-through breakdown voltage of 1500 V, which is suitable for a 1200 V rating of a power transistor, i.e. for a 1200 V rated SiC BJT.

In prior art devices, the punch-through breakdown voltage is difficult to predict, in particular because of the positive surface potential resulting from the presence of a deposited surface passivation layer and creating a depletion region extending below the base surface (and possibly also creating an electron inversion layer at the surface of the BJT). In addition, there may be a certain amount of over-etch at the base-emitter junction of an epitaxial BJT and in particular there may be a higher over-etch, so-called trenching, locally at the edge of the emitter mesa. Punch-through breakdown can occur as the depletion region from the base-collector junction reaches the etched surface. Further, redistribution of material during ion implantation annealing (for the implanted ions under the base contact, see region 142 in FIG. 1) may also increase the risk of punch-through (i.e. reducing the punch-through breakdown voltage) by producing nitrogen doping (i.e. n-type doping) in the etched trench. The punch-through breakdown voltage obtained in prior art devices is dependent on the above mentioned issues and the reliability of prior art methods for designing and fabricating SiC BJTs in terms of achievable punch-through breakdown voltage is therefore limited. In prior art BJTs, the parameters of the base region are determined in an empirical manner and the base dose for a 1200 V rated BJT is generally $2 \times 10^{13}$ cm$^{-2}$, i.e. higher than for the SiC BJT of the present invention. Thus, the present invention is also advantageous in that it enables design of SiC BJTs with a low base dose $Q_B$, which provides a higher current gain.

With the surface gate configured to apply a negative potential to the deposited surface passivation layer with respect to the electric potential of the base region, the punch-through breakdown voltage reaches, or at least is close to, the values as determined by equation 1. The present invention is therefore advantageous in that it provides a more reliable method for designing and fabricating SiC BJTs in terms of achievable punch-through breakdown voltage. A likely explanation for the improved breakdown voltage using a surface gate according to the present invention is that the negative potential at the surface gate repels electrons and suppresses the formation of an electron inversion layer and the formation of a depletion region below the base top surface. It will be appreciated that after deposition and anneal of the surface passivation layer, a depletion region may be formed and, in some cases, wherein the surface potential induced by the surface passivation layer is even more enhanced, an electron inversion layer may also be formed. In the latter cases, the surface gate is configured to apply a negative potential sufficient for suppressing both the depletion region and the electron inversion layer.

Figure 6:
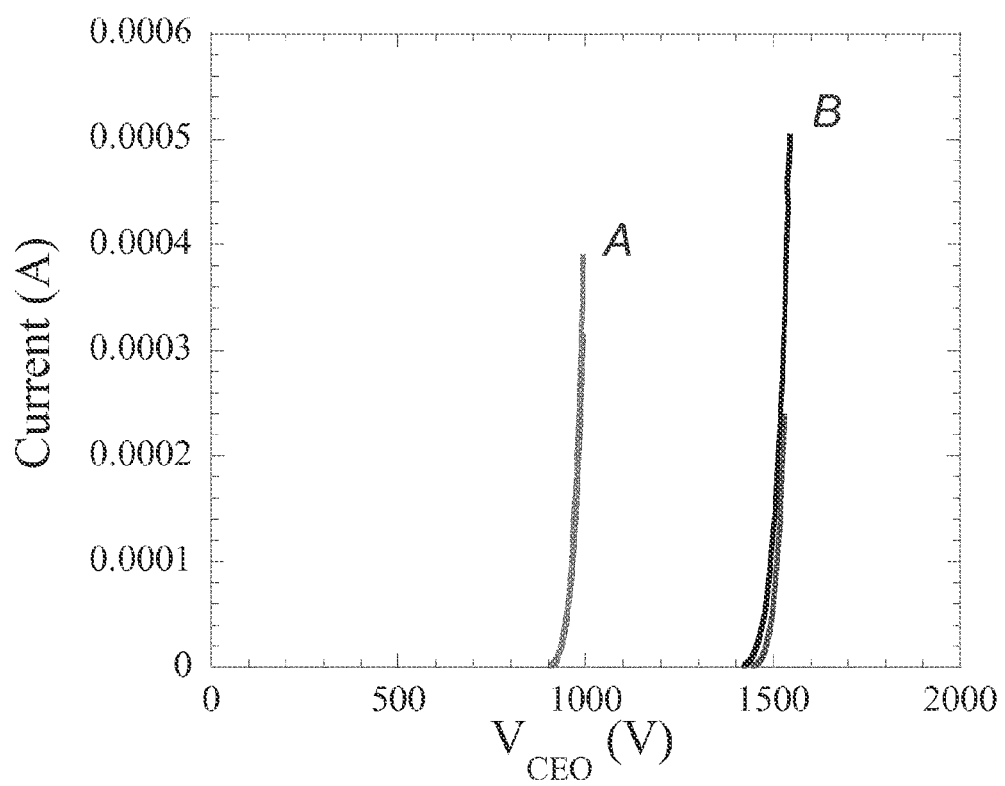
FIG. 6 shows the open-base blocking characteristics of four BJTs located close to each other on the same wafer, wherein two of the BJTs are manufactured without any surface gate and two of the BJTs include a surface gate in accordance with an embodiment of the present invention.

FIG. 6 shows measured open-base blocking characteristics for four BJTs located close to each other on the same wafer. Two of the BJTs, for which the characteristics are denoted B, comprise a surface gate connected to the emitter contact (i.e. an emitter extended surface gate). These two BJTs have an open-base breakdown voltage of about 1500 V. The two other BJTs, for which the characteristics are denoted A, have no surface gate and have open-base breakdown voltages of about 950 V.

According to secondary ion mass spectrometry (SIMS) measurements on test structures on the same wafer as the BJTs measured in FIG. 6, the base dose is about $1.4 \times 10^{13}$ cm$^{-2}$. According to equation 1 (or as shown in FIG. 5), such a base dose would lead to a punch-through breakdown voltage of 1760 V, which is relatively close to the value of 1500 V measured for the BJTs comprising an emitter extended gate in accordance with the present invention. The results in FIG. 6 together with the SIMS measurement of the base dose clearly illustrates the efficiency of the present invention in improving the collector-emitter punch-through breakdown voltage for SiC BJTs.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

What is claimed is:

1. A silicon carbide (SiC) bipolar junction transistor (BJT), comprising:
   a collector region;
   a base region having an extrinsic part;
   an emitter region;
   a surface passivation layer deposited on the extrinsic part between an emitter contact contacting the emitter region and a base contact contacting the base region; and
   a surface gate at the surface passivation layer, the surface gate having at least a portion disposed over the extrinsic part of the base region.

2. The SiC BJT of claim 1, wherein the surface passivation layer is disposed between the base contact and at least one of a sidewall of the emitter region or a sidewall of a base-emitter junction formed by the base region and the emitter region.

3. The SiC BJT of claim 1, wherein the surface passivation layer is disposed on the surface of the BJT between the emitter contact and the base contact.

4. The SiC BJT of claim 1, wherein the surface passivation layer extends from the emitter contact towards the base contact.

5. The SiC BJT of claim 1, wherein the surface passivation layer includes a dielectric material.

6. The SiC BJT of claim 1, wherein the surface passivation layer is a plasma enhanced chemical vapor deposited layer of silicon dioxide.

7. The SiC BJT of claim 1, wherein the surface gate includes a conductive material.

8. The SiC BJT of claim 1, wherein the surface gate includes at least one of a metal or doped poly-silicon.

9. The SiC BJT of claim 1, wherein the surface gate is electrically connected to the emitter contact.

10. The SiC BJT of claim 1, wherein the surface gate is configured to apply a negative electric potential to the surface passivation layer with respect to an electric potential in the base region.

11. The SiC BJT of claim 1, wherein the emitter region and the collector region includes n-type SiC and the base region includes p-type SiC.

12. A device, comprising:
    a first region of n-type silicon carbide (SiC);
    a second region of p-type SiC disposed on the first region;
    a third region of n-type SiC disposed on the second region, the third region and a part of the second region defining a mesa;

a dielectric layer deposited on the mesa between a first contact contacting the second region and a second contact contacting the third region; and an electrode disposed on the dielectric layer and having a portion disposed between a sidewall of the mesa and the first contact.

13. The device of claim 12, wherein the dielectric layer includes deposited silicon dioxide.

14. The device of claim 12, wherein the electrode includes a conductive material.

15. The device of claim 12, wherein the dielectric layer has a thickness which is less than a thickness of either one of the first contact or the second contact.

16. The device of claim 12, wherein the dielectric layer is disposed on the second region between the sidewall of the mesa and the first contact.

17. The device of claim 12, wherein the electrode is electrically connected to the second contact.

18. A silicon carbide (SiC) bipolar junction transistor (BJT), comprising:

a collector region;

a base region;

an emitter region defining an elevated structure having a sidewall;

a surface passivation layer deposited between an emitter contact contacting the emitter region and a base contact contacting the base region; and a surface gate at the surface passivation layer and separated from the base contact by a first gap, the surface gate being separated from the sidewall of the elevated structure of the emitter region by a second gap.

19. The SiC BJT of claim 18, wherein the surface gate is separated from a sidewall defined by the surface passivation layer.

20. The SiC BJT of claim 18, wherein the base region has an extrinsic part, the surface passivation layer is deposited on the extrinsic part.

* * * * *